United States Patent [19]

Stevens

[11] 4,016,488
[45] Apr. 5, 1977

[54] PULSING GROUND-TEST CIRCUIT

[75] Inventor: William M. Stevens, Loveland, Ohio

[73] Assignee: Hill-Rom Company, Inc., Batesville, Ind.

[22] Filed: Oct. 4, 1974

[21] Appl. No.: 512,078

[52] U.S. Cl. .................................. 324/51; 340/255
[51] Int. Cl.² ........................................ G01R 31/02
[58] Field of Search .................... 324/51; 317/18 B; 340/255

[56] References Cited

UNITED STATES PATENTS

| 3,176,219 | 3/1965 | Behr | 324/51 |
| 3,407,336 | 10/1968 | Embree | 340/255 X |
| 3,699,432 | 10/1972 | Brown | 324/51 |
| 3,716,876 | 2/1973 | Petzon et al. | 5/68 |
| 3,809,961 | 5/1974 | Kershaw | 317/18 B |
| 3,810,003 | 5/1974 | Portoulas | 324/51 |
| 3,913,153 | 10/1975 | Adams et al. | 318/65 X |

Primary Examiner—James B. Mullins

[57] ABSTRACT

Ground-test device operating intermittently for brief periods of time to limit the current entering the ground system. The circuit itself, on the occurrence of a pre-designated event in other circuitry, may initiate the tests for ground. The circuit disconnects itself from ground between tests. The device also develops an indication when the wiring from the source of a.c. power suffers from reversed polarity.

23 Claims, 3 Drawing Figures

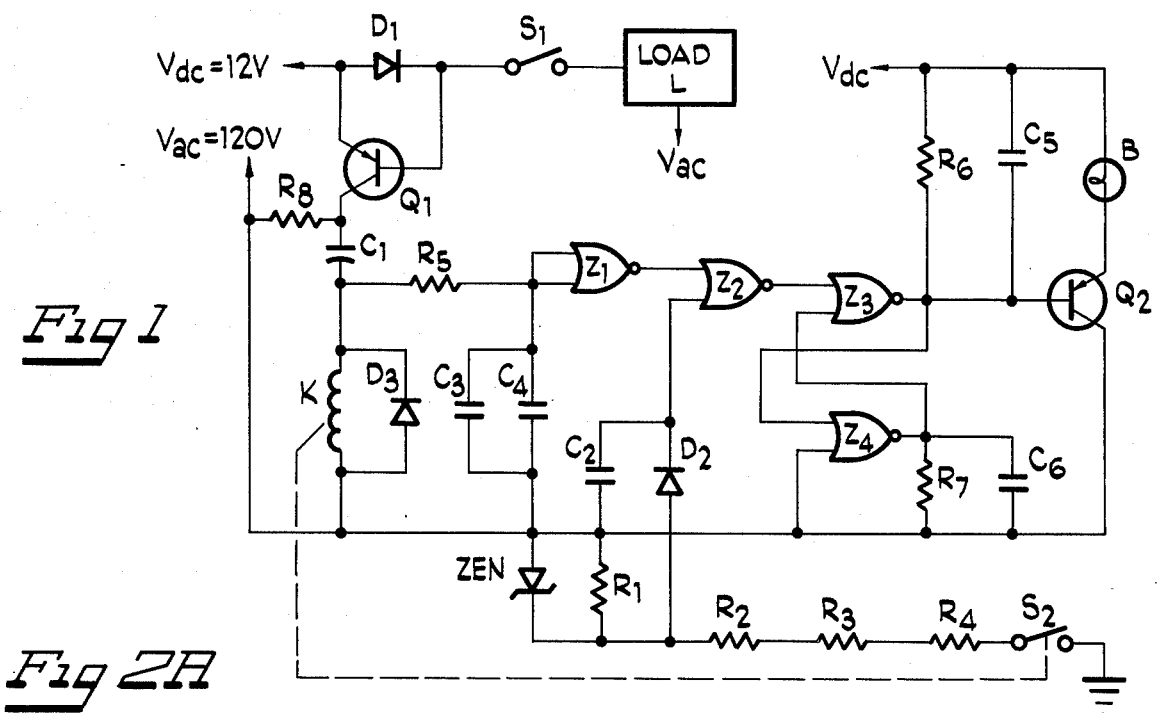
*Fig 1*
*Fig 2A*
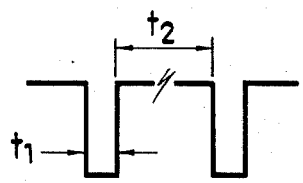
*Fig 2*
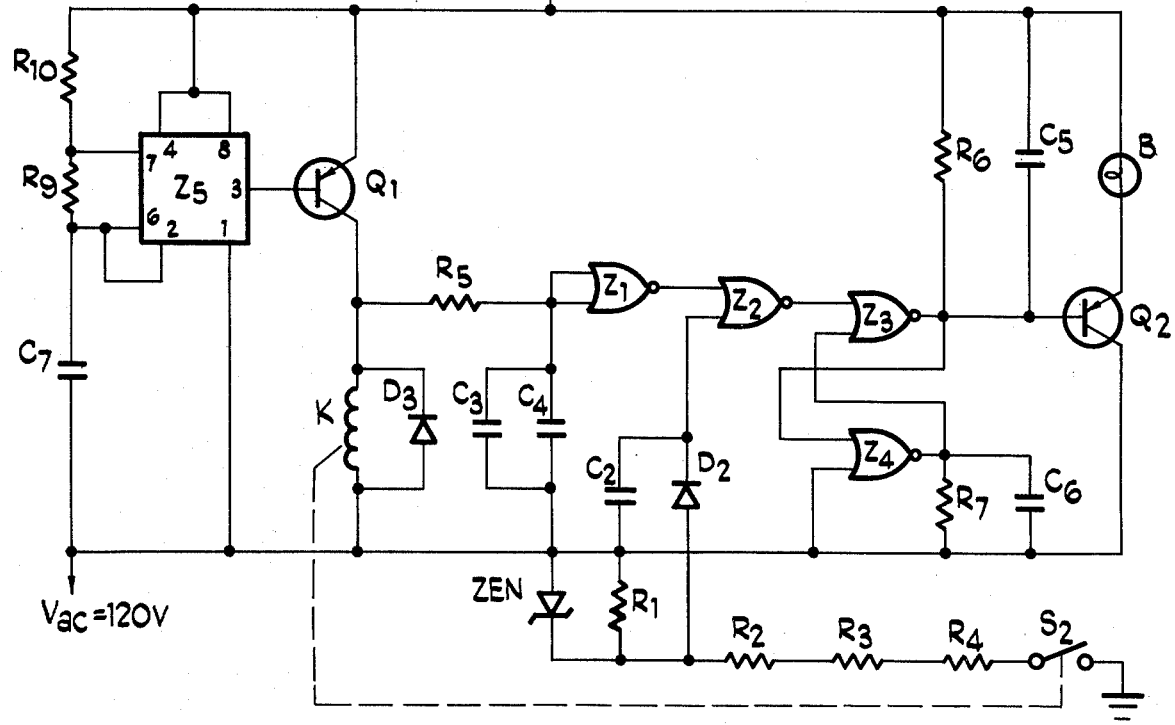

PULSING GROUND-TEST CIRCUIT

BACKGROUND

To provide protection from the possibility of electrical shock, many appliances provide a connection between their exposed metallic portions and electrical ground. Should this connection fail for some reason, its measure of protection no longer remains available.

Most modern hospital beds include at least some electrical facilities, especially one or more motors to alter its configuration. Because of the possibly prolonged and intimate contact of a patient's skin with the bed frame, the connection to ground represents a particularly important safeguard. Accordingly, the safety of the bed increases where it includes an indication that its connection to ground remains intact.

A. P. Petzon et al.'s U.S. Pat. No. 3,716,876 incorporates, in the circuitry for a bed, a ground-indicating device. However, this simply amounts to a light bulb connected between ground and the side of the transformer receiving the a.c. power.

This device, consequently, suffers from two serious limitations. First, it lacks any ability to indicate when the a.c. voltage source has reversed polarity, with the "hot" wire appearing at the common terminal and vice versa.

Second, all current passing through the bulb, which generally remains lit, enters the ground system. The bulb from each bed would pass at least about one milliampere. In a hospital having several hundreds of beds, the current in the supposedly safe ground system could well exceed onequarter of an ampere, an unacceptably high level.

SUMMARY

Typically, a ground-test circuit includes a testing means to detect the absence of a connection to ground. The circuit will also have responding means to develop a physical response to the absence of the appropriate ground connection. This latter may include a buzzer or the absence or presence of a light, or even a relay device affecting another part of the circuit.

However, a limitation of the current entering the ground system can result where the responding means connects to a switching means which controls its current. Rather than the responding means, this allows the switching device, with only a negligble flow of current, to couple to ground. This eliminates the necessity of any leads of the responding means connecting to the ground wire.

As an additional or separate aspect, the circuit may also include interrupting means for limiting the time during which any current may flow from it to ground. Making the time periods sufficiently small minimizes the average current passing into the system.

A limitation on the ground current may also result if the circuit can only occassionally conduct a test. To achieve this object, the device should include an activation means which intermittently permits the testing means to detect the absence of a connection to ground, while at other times prohibiting such a test.

BRIEF DESCRIPTION OF THE FIGURES

FIG. 1 shows a ground-test circuit which intermittently conducts tests upon the occurrence of events in other circuit portions.

FIG. 2 gives a circuit similar to FIG. 1 except for the inclusion of a pulsing component to initiate tests for ground.

FIG. 2A shows the pulses provided by the pulsing component of FIG. 2.

DETAILED DESCRIPTION

The figures show two variants of a ground test circuit utilizing pulses of current. When the circuit detects the loss of contact with ground or a reversal in the polarity in the a.c. power source, the bulb B lights and remains on.

The particular circuit of FIG. 1, mentioned in J. S. Adams et al.'s U.S. Pat. application Ser. No. 496,211, now U.S. Pat. No. 3,913,153, utilizes two sources of potential. The first power source, $V_{ac}$, connects a hot wire of an appliance, such as a hospital bed, to the usual line voltage of approximately 120 volts a.c. The second power supply, $V_{dc}$, provides a d.c. potential of 12 V. with respect to the hot wire to which the 120 volts $V_{ac}$ is applied. Thus, measuring the potential drop between ground and $V_{dc}$ will show an a.c. potential of 120 V. superimposed upon a d.c. potential of 12 V. The d.c. potential is applied across a series of a diode $D_1$, an intermittently operating switch $S_1$, and a load L. As discussed below, each time the switch $S_1$ closes, the circuit will test for a proper connection to ground and a proper polarity in the a.c. power source's wiring.

In the adjustable bed shown in the application of Adams et. al., the switch $S_1$ actually includes a number of switches, each constituting part of a reed relay. The load L takes the form of resistors connecting these switches to triacs controlling the flow of current to the bed's motors. Each time the actuation of a button on the bed results in the operation one of the bed's motors, a switch closes and will result in an additional testing of the electrical connections.

With the switch $S_1$ open, no current flows through the diode $D_1$ and no potential drop appears across that component. Consequently, the emitter and base of the transistor $Q_1$ exist at the same potential which precludes the conduction of current by transistor $Q_1$. When the switch $S_1$ closes, current flows through diode $D_1$ and produces a potential drop of approximately 0.6 V. across the diode $D_1$. This potential drop also appears between the emitter and the base of the transistor $Q_1$ with the base at the lower voltage. This difference turns on the transistor $Q_1$ to allow a test by the circuit.

With the transistor $Q_1$ conducting, the capacitor $C_1$ begins to charge. It does so by drawing current through the induction coil K which forms parts of a reed relay device. The current through the coil K closes the switch portion $S_2$ of the reed relay.

When the switch $S_2$ closes, it allows current to flow through and a potential drop to develop across the series of resistors $R_1$, $R_2$, $R_3$ and $R_4$. A judicious selection of these resistors, for example, 240 kilohms for $R_1$ and 1 megohm for each of the other three, results in a potential drop of approximately 10 V. a.c. across the resistor $R_1$.

The diode $D_2$ rectifies this 10 V. a.c. to charge the capacitor $C_2$ whose negative side connects to both the common connection and the resistor $R_1$. The positive side of capacitor $C_2$ connects to the NOR gate $Z_2$. In charging, the capacitor $C_2$ at some point raises the potential at the lower input of the NOR gate $Z_2$ from the logical ZERO state to the logical ONE state.

During the charging of the capacitor $C_2$, the capacitors $C_3$ and $C_4$ also charge but more slowly. This slower rate derives from their charging across the relatively large resistor $R_5$, for example, 2.2 megohm. Moreover, if chosen the same as the capacitor $C_2$, in parallel they effectively display twice the capacitance and, accordingly, half the charging rate.

At some point, they will cause the tied-together inputs to the NOR gates $Z_1$ to go from logical ZERO state to ONE. With its inputs connected to each other, the NOR gate $Z_1$ simply acts as an inverter. Consequently, when the input goes to ONE, its output becomes ZERO.

Thus, the testing cycle proceeds in three phases. The first phase occurs before and immediately after the closing of the switch $S_1$. At that time, $C_3$ and $C_4$ bear no charge, with any prior charge having dissipated through the resistor $R_5$. Accordingly, the input to the NOR gate $Z_1$ remains ZERO with its output at ONE. This output of ONE becomes an input to the NOR gate $Z_2$. Since a NOR gate has an output of ZERO unless both of its inputs occupy the ZERO state, the input of ONE to $Z_2$ from $Z_1$ guarantees it a ZERO output.

The output of the NOR gate $Z_2$ then feeds into the NOR gate $Z_3$, which, with the NOR gate $Z_4$, forms a flip-flop. As discussed below, when the power initially turns on, this flip-flop sets itself with the output from the NOR gate $Z_3$ providing a ONE to the base of the transistor $Q_2$. The ZERO output from $Z_2$ to $Z_3$ will not disturb the ONE to the transistor $Q_2$. This ONE at the base of the transistor $Q_2$ turns the transistor off and keeps the bulb B from lighting.

The second phase of the circuit's operation begins when $C_2$ has charged sufficiently to raise the lower input to the NOR gate $Z_2$ from ZERO to ONE. At this point, both inputs to the NOR gates $Z_2$ occupy the ONE state. With neither input ZERO, the NOR gate $Z_2$ still provides a ZERO output which results in a ONE from the NOR gate $Z_3$ to the transistor $Q_2$ and an unlit bulb B.

Phase three commences when $C_3$ and $C_4$ charge sufficiently to raise the input to the NOR gate $Z_1$ from ZERO to ONE. This gives the NOR gate $Z_1$ a ZERO output which becomes one of the inputs to the NOR gate $Z_2$. The ONE input to the NOR gate $Z_2$ from the capacitor $C_2$ still results in a ZERO input to and output from the NOR gate $Z_3$ as before. Thus, during all of these three phases, the output from the NOR gate $Z_3$ to the base of the transistor $Q_2$ has not changed. It has remained at ONE, leaving the bulb B unlit.

As the capacitor $C_1$ becomes fully charged, current in the coil K diminishes and no longer suffices to hold the switch $S_2$ closed. When the switch $S_2$ opens, the forward biasing of the diode $D_2$ produced by the driving potential across the resistor $R_1$ disappears. The capacitor $C_2$ consequently becomes relatively isolated, since its charge reverse biases the diode $D_2$, and does not readily discharge. The only other current flow to discharge the capacitor $C_2$ passes through the NOR gate $Z_2$ which, accordingly, should have a high input impedance.

As a result of its slow discharge time, the capacitor $C_2$ retains the lower input to the NOR gate $Z_2$ in the ONE state, while the capacitors $C_3$ and $C_4$ discharge through the resistor $R_5$. When the input to the NOR gate $Z_1$ from the capacitors $C_3$ and $C_4$ has dropped from ONE to ZERO the output of $Z_1$ becomes a ONE and insures the continuance of a ZERO output from the NOR gate $Z_2$.

Finally, the capacitor $C_2$ discharges and provides the NOR gate $Z_2$ with a ZERO. However, at that time, NOR gate $Z_1$ has switched to providing the NOR gate $Z_2$ with a ONE input. This assures that the gate $Z_2$ will continue to have a ZERO output.

Thus, during the entire testing cycle, the output from the NOR gate $Z_3$ of the flip-flop remains at ONE. This ONE input to the base of the transistor $Q_2$ maintains it in an off state, precluding current from flowing through it or through the bulb B. The bulb B, in its unlit state, indicates that the electrical connections remain satisfactory.

The foregoing discussion has assumed that, throughout the operation of the circuit, the wiring of the a.c. power supply has proper polarity and a good connection to ground. Should either of these conditions fail to exist, the circuit will light the bulb B which will remain lit.

In particular, if the circuit's ground connection becomes disconnected from actual ground, then closing the switch $S_1$ will still produce a potential drop across the diode $D_1$, turning on the transistor $Q_1$ and charging the capacitor $C_1$. The latter involves current flowing through the coil K with the closure of the switch $S_2$. However, with no connection to ground to the right of the switch $S_2$, no current flows through the resistors $R_2$, $R_3$, $R_4$, or, in particular, $R_1$. The absence of current precludes a potential drop across the resistor $R_1$, with the result that the capacitor $C_2$ cannot charge and the input from the capacitor $C_2$ to the NOR gate $Z_2$ remains ZERO.

The charging of the capacitor $C_1$, which proceeds as before, eventually charges the capacitors $C_3$ and $C_4$ which provide a ONE input to the NOR gate $Z_1$. The NOR gate $Z_1$ converts the ONE to a ZERO which constitutes an input to the NOR gate $Z_2$.

At this point, the NOR gate $Z_2$ with two ZERO inputs, will provide a ONE as its output and as the input to the NOR gate $Z_3$ of the flip-flop composed of the NOR gates $Z_3$ and $Z_4$. The ONE input to $Z_3$ changes the state of the flip-flop causing the output from the NOR gate $Z_3$ to the base of the transistor $Q_2$ to jump to the ZERO state. This voltage level turns on the transistor $Q_2$, allowing current to flow from its emitter to its collector. This current flow passes through the bulb B and lights it.

Since the lower input to the NOR gate $Z_4$ of the flip-flop remains tied to a ZERO voltage level, no mechanism exists for reversing the state of the flip-flop once the output of $Z_3$ has assumed the ZERO state. Accordingly, the bulb B remains lit to indicate the breaking of the connection to ground. A double-pole double-throw switch reversing the free inputs to the NOR gates $Z_3$ and $Z_4$ will reset the flip-flop.

If the wiring to the a.c. power source becomes reversed, then the hot wire will have a potential of about zero volts and the common wire will have 120 V., the "reversed polarity" situation. In this instance, the resistor $R_1$ will connect, on the one side, through the resistors $R_2$, $R_3$ and $R_4$ and the switch $S_2$ to ground. On the other side, it will connect to a wire at zero volts because of the miswiring of the a.c. power source. With no potential drop across resistor $R_1$, the capacitor $C_2$ cannot charge. Consequently, it will provide a ZERO input to the NOR gate $Z_2$. Nonetheless, the capacitors $C_3$ and $C_4$ will charge and give a ZERO as the other input to the NOR gate $Z_2$. The output of $Z_2$ will go to ONE, change the state of the flip-flop of the NOR gates $Z_3$ and $Z_4$, turn on the transistor $Q_2$, and light the bulb B to indicate a problem.

The resistors $R_6$ and $R_7$ and the capacitors $C_5$ and $C_6$ properly set the flip-flop of the NOR gates $Z_3$ and $Z_4$ when the circuit first receives power. The resistor $R_6$ and the capacitor $C_5$ connect to the potential $V_{dc}$ and pull the output of the NOR gate $Z_3$ and the input of the NOR gate $Z_4$ to the ONE state. Simultaneously, the resistor $R_7$ and the capacitor $C_6$, which connect to $V_{ac}$, pull the output of the NOR gate $Z_4$ and the input of the NOR gate $Z_3$ to ZERO. As a result, the output of the NOR gate $Z_3$ initially settles into the ONE state where it causes the bulb B not to light. The capacitors $C_5$ and $C_6$ present low impedance to the initial transient voltage and allow the NOR gates to feel their effects more rapidly.

Upon the opening of the switch $S_1$ after a test, no current flows across the diode $D_1$, and the transistor $Q_1$ turns off. Since the capacitor $C_1$ no longer connects to the voltage source of $V_{dc}$, it discharges through the resistor $R_8$. Also, the diode $D_3$ allows for the dissipation of the energy stored in the coil K upon the opening of the transistor $Q_1$.

Lastly, the Zener diode ZEN products the circuit during the high-potential tests required by the Underwriter's Laboratories. The test involves connecting the circuit's ground connection to one side of a 1240 V. a.c. potential while the other side of this a.c. potential connects to the circuit's two a.c. connections. This test would impose the entire 1240 V. across the resistor $R_1$ which usually connects between ground and the 120 volt line. The 1240 V. potential charging through the diode $D_2$, stored on the capacitor $C_2$, and acting as one of the inputs to the NOR gate $Z_2$ could well have deleterious, if not destructive, effects upon the circuit. The Zener diode ZEN limits the voltage across the resistor $R_1$ and thus into the circuit to a safe level, such as 14 V.

FIG. 2 shows a ground test similar to that in FIG. 1 except that it includes a pulsing device to initiate its own tests. Furthermore, as the pulser also limits the time during which the circuit connects to ground, the need for the capacitor $C_1$, which served this purpose in FIG. 1, no longer exists.

The timer $Z_5$ provides the necessary pulses both to initiate tests for ground and also to close the switch $S_2$ leading to the ground connection. In the Signetics Model 555 timer used for $Z_5$, the pins 4 and 8 tie together and also to the 12 V. supply $V_{dc}$. The resistor $R_{10}$ separates the pin 7 from $V_{dc}$ while the resistor $R_9$ separates the pin 7 from pin 6, with pins 6 and 2 tied together. A capacitor $C_7$ separates pin 6 from the 120 V. supply $V_{ac}$ while the pin 1 connects directly to $V_{ac}$. Arranged in this fashion, the pulsedoutput shown in FIG. 2A appears at pin 3 of the timer $Z_5$.

The output provides negative pulses of duration of $t_1$ separated by intervals $t_2$. The lengths of the periods $t_1$ and $t_2$ depend upon the values for the resistors $R_9$ and $R_{10}$ as well as the capacitor $C_7$. These relate to each other according to the following equations:

$$t_1 = 0.693 \, R_9 \, C_7 \quad (1)$$

$$t_2 = 0.693 \, (R_9 + R_{10}) C_7 \quad (2)$$

Using a 260 ohm resistor for $R_9$, a 1.43 megohm resistor for $R_{10}$, and a 100 microfarad capacitor for $C_7$, $t_1$ will have a value of 18 milliseconds, while $t_2$ has a duration of 100 seconds.

Thus, the timer $Z_5$ usually provides a voltage level to the base of the transistor $Q_1$ sufficiently high to prevent current through it. Consequently, no current can pass through the coil K of the reed relay and the switch $S_2$ remains open. During this comparatively lengthy time period, of course, the circuit does not test for ground.

However, once every 100 seconds, the voltage from pin 3 of the timer $Z_5$ to the base of the transistor $Q_1$ drops sufficiently to turn the transistor on. Current then flows through the coil K and closes the switch $S_2$. The circuit may then test for ground as in FIG. 1. After 18 milliseconds, the voltage from the timer $Z_5$ again rises, turning off the transistor $Q_1$ and opening the switch $S_2$. Thus, the end of the time period $t_1$ stops any further current from flowing to the ground system through the switch $S_2$. Consequently, the necessity for the capacitor $C_1$ in the circuit of FIG. 1 disappears.

The circuits in FIGS. 1 and 2 limit the current passing into a building's ground system by disconnecting themselves for most of the time from ground. The ground connection in FIG. 1 only connects to actual ground when the switch $S_1$ closes to actuate the load L. Thus, current can reach ground only when the load L, a hospital bed for example, becomes activated.

In FIG. 2, the timer $Z_5$ only allows current to enter the ground system once every 100 sec. Since this represents a significantly more frequent occurrence than changing a bed's configuration, it will show an upper limit on the time-averaged current flowing to ground.

When the switch $S_2$ closes, 120 Vrms. appears across the resistors $R_1$, $R_2$, $R_3$ and $R_4$, having a total resistance of 3.24 megohm. This gives a current of 37.0 microamps. However, this current only lasts for 18 msec. out of each 100 sec. period. Time-averaging the current gives an average current of $6.6 \times 10^{-5}$ microamps for the circuit. This last figure appears to approach a valid estimate of the effect upon the living body of these short pulses of current.

The components used in the FIGURES appear in the following TABLE:

TABLE

| Components used in the figures | |
|---|---|
| Component | Identification |
| B | 14 V. |
| $C_1$ | 100 μF. |
| $C_2, C_3, C_4, C_5, C_6$ | .01 μF. |
| $C_7$ | 100 μF., 25 V. |
| $D_1$ | 1N4001 |
| $D_2$ | 1N4148 |
| K, $S_2$ | R 4534–1 |
| $Q_1, Q_2$ | 2N3906 |
| $R_1$ | 240 KΩ |
| $R_2, R_3, R_4$ | 1 MΩ |
| $R_5$ | 2.2 KΩ |
| $R_6, R_7, R_8$ | 10 KΩ |
| $R_9$ | 260Ω |
| $R_{10}$ | 1.43 MΩ |
| $Z_1, Z_2, Z_3, Z_4$ | 4001 |
| $Z_5$ | Signetics NE 555 |
| ZEN | 14 V. d.c., 5%, 1W. |

Accordingly, what is claimed is:

1. A ground test device for an appliance energized by an alternating current power source, a hot wire of the appliance to be connected to the high voltage side of the power source and a common wire of the appliance ot be connected to ground, comprising:

activation means to intermittently cause a ground connection from the hot wire to ground to be completed;

testing means responsive to current flow conditions in said ground connection;

responding means actuated by said testing means if the common of the appliance is not properly grounded or if the polarity of the connections from the power source to the hot wire and the common of the appliance are incorrect; and a supplemental power supply having one side thereof connected to the hot wire of the appliance so that said supplemental power supply is in series with the alternating current power source, in order to energize said activation means and said responding means without any current flow to ground.

2. A ground-test device as claimed in claim 1 wherein said activation means comprises a load switch actuated upon each energization of the appliance.

3. A ground-test device as claimed in claim 1 wherein said activation means comprises a pulsing device producing activating pulses to periodically cause said ground connections to be completed, said ground connection being completed for a relatively short time with respect to the time duration between said activating pulses.

4. A ground-test device as claimed in claim 1 and further comprising:

a ground connection lead from the hot wire to ground through which said ground connection is to be completed;

a normally open switch in said ground connection lead; and control means to actuate said switch upon being energized by said supplemental power supply in response to said activation means.

5. A ground-test device as claimed in claim 4 wherein:

said switch is a pair of relay contacts;

said control means is a relay coil; and said activation means comprises an electronic switching device to connect said relay coil across said supplemental power supply when said switch is to be closed.

6. A ground-test device as claimed in claim 1 wherein said testing means comprises:

gating means having a first binary input and a second binary input, said gating means producing a change in its binary output if said second binary input changes while said first binary input remains unchanged;

first timing means coupled to said ground connection lead and providing said first binary input for said gating means, said first timing means changing said first binary input to said gating means a first predetermined time after said electronic switching means energizes said relay coil, if current flows through said ground connection lead after closing of said switch; and second timing means providing said second binary input for said gating means, said second timing means changing said second binary input to said gating means a second predetermined time after said electronic switching means energizes said control means, said second predetermined time being longer than said first predetermined time.

7. A ground-test device as claimed in claim 6 and further comprising a third timing means to de-energize said relay coil to open said switch a third predetermined time after said electronic switching means energizes said relay coil, said third predetermined time being longer than said second predetermined time.

8. A ground-test device as claimed in claim 7 wherein:

said activation means further comprises a load switch closed upon each energization of the appliance to actuate said electronic switching means; and said third timing means comprises a capacitor in series with said relay coil to limit current flow through said relay coil to open said relay contacts after said third predetermined time.

9. A ground-test device as claimed in claim 7 wherein:

said activation means further comprises a pulsing circuit producing pulses to periodically actuate said electronic switching means; and said third timing means comprises a timing portion of said pulsing circuit to cause said pulses to have a duration equal to said third predetermined time, said third predetermined time being very short relative to the time duration between said pulses.

10. A ground-test device as claimed in claim 1 and further comprising locking means to maintain said responding means in the actuated state, if there was no current flow in said ground connection lead, after said binary output of said gating means returns to its original state.

11. A ground-test device as claimed in claim 10 wherein said locking means comprises a flip-flop circuit having an internal feedback to preclude a change in the states of the flip-flop elements, after actuation of said responding means, without external resetting.

12. A ground-test device for an appliance energized by an alternating current power source, a hot wire of the appliance to be connected to the high voltage side of the power source and a common of the appliance to be connected to ground, comprising:

activation means to intermittently cause a ground connection from the hot wire to ground to be completed;

testing means responsive to current flow conditions in said ground connection;

responding means activated by said testing means if the common of the appliance is not properly grounded or if the polarity of the connections from the power source to the hot wire and the common of the appliance are incorrect; and interrupting means to permit current flow through said ground connection only for a limited predetermined time.

13. A ground-test device as claimed in claim 12 and further comprising:

a ground connection lead from the hot wire to ground through which said ground connection is to be completed;

a normally open switch in said ground connection lead; and control means to actuate said switch upon being energized in response to said activation means.

14. A ground-test device as claimed in claim 13 wherein said testing means comprises:

gating means having a first binary input and a second binary input, said gating means producing a change in its binary output if said second binary input changes while said first binary input remain unchanged;

first timing means coupled to said ground connection lead and providing said first binary input for said gating means, said first timing means changing said first binary input to said gating means a first predetermined time after said activation means energizes said control means, if current flows through said ground connection lead after closing of said switch; and second timing means providing said second binary input for said gating means, said second timing means changing said second binary input to said gating means a second predetermined time after said activation means energizes said control means, said second predetermined time being longer than said first predetermined time.

15. A ground-test device as claimed in claim 14 wherein said interrupting means comprises third timing means to deenergize said control means to open said switch a third predetermined time after said activation means energizes said control means, said third predetermined time being longer than said second predetermined time.

16. A ground-test device for an appliance energized by an alternating current power source, a hot wire of the appliance to be connected to the high voltage side of the power source and a common of the appliance to be connected to ground, comprising:
a ground connection lead extending from the hot wire of the appliance to ground;
a normally open switch in said ground connection lead;
control means to actuate said switch;
a supplemental direct current power supply having one side thereof connected to the hot wire;
activation means to intermittently cause said control means to be energized by said supplemental power supply to close said switch;
gating means having a first binary input and a second binary input, said gating means producing a change in its binary output if said second binary input changes while said first binary input remains unchanged;
first timing means coupled to said ground connection lead and providing said first binary input for said gating means, said first timing means changing said first binary input to said gating means for a first predetermined time after said activation means energizes said control means, if current flows through said ground connection lead after closing of said switch;
second timing means providing said second binary input for said gating means, said second timing means changing said second binary input to said gating means a second predetermined time after said activation means energizes said control means, said second predetermined time being longer than said first predetermined time, so that said binary output does not change if current flows in said ground connection lead after closing of said switch;
responding means to be actuated upon a change in said binary output of said gating means as a result of no current flow through said ground connection lead after closing of said switch;
locking means for maintaining said responding means in the actuated state after said binary output of said gating means returns to its original state; and
third timing means to de-energize said control means to open said switch a third predetermined time after said activation means energizes said control means, said third predetermined time being longer than said second predetermined time.

17. A ground-test device as claimed in claim 16 wherein:
said ground connection lead comprises a voltage divider having an intermediate terminal;
said switch is a pair of normally open relay contacts;
said control means comprises a relay coil;
said gating means is a binary logic gate; and
said activation means comprises a transistor having its emitter-collector circuit connected in series with said relay coil.

18. A ground-test device as claimed in claim 17 wherein:
said activation means further comprises a diode connected between the emitter and base of said transistor and a load switch, energization of the appliance closing said load switch to forward bias said transistor across said diode; and
said third timing means comprises a capacitor connected in series with said transistor and said relay coil.

19. A ground-test device as claimed in claim 17 wherein:
said activation means comprises a pulsing circuit to periodically apply an activating pulse to the base of said transistor; and
said third timing means comprises a timing portion of said pulsing circuit to cause said activating pulses to have a duration of said third predetermined time, said third predetermined time being short relative to the time duration between said activating pulses.

20. A ground-test device as claimed in claim 17 wherein said first timing means comprises:
a diode connected from said ground connection lead to a first input terminal of said logic gate; and
a capacitor connected from the hot wire to said first input terminal of logic gate.

21. A ground-test device as claimed in claim 20 wherein said second timing means comprises:
an inverter circuit having its output connected to a second input terminal of said logic gate; and
a capacitive network connected from the hot wire to the input of said inverter circuit.

22. A ground-test device as claimed in claim 21 wherein:
said responding means comprises a light bulb having said supplemental direct current power supply connected thereacross;
a transistor has its emitter-collector circuit connected in series with said light bulb; and
said locking means comprises a flip-flop circuit having its output connected to the base of said transistor in series with said light bulb.

23. A ground-test device as claimed in claim 22 and further comprising:
a diode connected across said relay coil;
a resistor connected from the hot wire to the collector of said transistor in series with said relay coil;
a resistor connected from between the capacitor in series with said relay coil and said relay coil to the input of said inverter circuit;
a Zener diode connected from the hot wire to said intermediate terminal of said voltage divider; and
parallel resistor-capacitor networks connected from said supplemental power supply to said flip-flop circuit to prevent said light bulb from being energized until properly actuated from said logic gate.

* * * * *